(12) United States Patent
Matsubara et al.

(10) Patent No.: US 8,734,627 B2
(45) Date of Patent: May 27, 2014

(54) POWER SUPPLY APPARATUS

(75) Inventors: Shinobu Matsubara, Kanagawa (JP); Yoshikuni Horishita, Kanagawa (JP); Atsushi Ono, Kanagawa (JP)

(73) Assignee: Ulvac, Inc., Kanagawa (JP)

( * ) Notice: Subject to any disclaimer, the term of this patent is extended or adjusted under 35 U.S.C. 154(b) by 0 days.

(21) Appl. No.: 13/504,159

(22) PCT Filed: Nov. 12, 2010

(86) PCT No.: PCT/JP2010/006660
§ 371 (c)(1),
(2), (4) Date: Apr. 26, 2012

(87) PCT Pub. No.: WO2011/064958
PCT Pub. Date: Jun. 3, 2011

(65) Prior Publication Data
US 2012/0205243 A1    Aug. 16, 2012

(30) Foreign Application Priority Data
Nov. 25, 2009  (JP) .................................. 2009-267075

(51) Int. Cl.
*C23C 14/54* (2006.01)
(52) U.S. Cl.
USPC ................................... 204/298.08
(58) Field of Classification Search
USPC ................................... 204/298.08
See application file for complete search history.

(56) References Cited

U.S. PATENT DOCUMENTS 5,682,067 A * 10/1997 Manley et al. ................ 307/127
6,113,760 A    9/2000 Kuriyama et al.
2006/0011473 A1 * 1/2006 Kuriyama et al. ....... 204/298.08
2007/0251813 A1   11/2007 Ilic et al.
2009/0008240 A1    1/2009 Ilic et al.

FOREIGN PATENT DOCUMENTS

| JP | 10-298754 A | 11/1998 |
|---|---|---|
| JP | 2000-029547 A | 1/2000 |
| JP | 2004-0006147 A | 1/2004 |
| JP | 2004-007885 A | 1/2004 |
| WO | WO2007/127896 A2 | 11/2007 |

OTHER PUBLICATIONS

International Search Report for PCT Patent App. No. PCT/JP2010/006660 (Dec. 28, 2010).
Office Action from Korean Patent App. No. 10-2013-7013179 (Sep. 2, 2013).

* cited by examiner

*Primary Examiner* — Keith Hendricks
*Assistant Examiner* — Jason M Berman
(74) *Attorney, Agent, or Firm* — Cermak Nakajima LLP; Tomoko Nakajima

(57) ABSTRACT

Provided is a power supply apparatus which can effectively restrict the current rise at the time of occurrence of arc discharge that is directly related to the occurrence of splashes or particles, and which is also capable of preventing the discharge voltage from getting excessive at the time of finishing the arc processing. The power supply apparatus has: a DC power supply unit which applies a DC voltage to a target which comes into contact with a plasma; and an arc processing unit which can detect arc discharge generated in the electrode by positive and negative outputs from the DC power supply unit, and also which can perform arc discharge suppression processing. An output characteristics switching circuit switches the outputs such that the output to the electrode has constant-current characteristics and that the output to the electrode has constant-voltage characteristics by the time of completion of the arc suppressing processing.

7 Claims, 5 Drawing Sheets

POWER SUPPLY APPARATUS

This application is a national phase entry under 35 U.S.C. §371 of PCT Patent Application No. PCT/JP2010/006660, filed on Nov. 12, 2010, which claims priority under 35 U.S.C. §119 to Japanese Patent Application No. 2009-267075, filed Nov. 25, 2009, both of which are incorporated by reference.

TECHNICAL FIELD

The present invention relates to a power supply apparatus which applies a DC voltage (apparatus to input electric power) to an electrode which comes into contact with a plasma.

BACKGROUND ART

As a method of forming a thin film on the surface of a substrate such as glass, silicon wafer, and the like, it is conventionally known to use a sputtering apparatus. In this sputtering apparatus, for example, a predetermined sputtering gas (argon gas) is introduced into a processing chamber in vacuum atmosphere, and a negative DC voltage is applied by a power supply apparatus to a target which is manufactured depending on the composition of the thin film to be formed on the surface of the substrate, thereby forming a plasma atmosphere. Then, ions in the plasma atmosphere are accelerated toward, and collide against, the target to thereby cause the sputtered particles (target atoms) to scatter and to get adhered to the surface of the substrate for deposition thereon, whereby a predetermined thin film is formed.

It is known that arc discharge (anomalous electric discharge) occurs for one reason or another during thin film forming by the above-mentioned sputtering apparatus. When arc discharge occurs, the impedance of the plasma (load) becomes rapidly low. Therefore, a rapid voltage drop occurs, accompanied by a consequent increase in current. Here, in case the target is of metallic make, especially of aluminum and the like, when arc discharge of high arc current value locally occurs on the target, the particles or splashes (blocks or masses of several μm to several hundreds μm) to be generated by melting and emission of the target will occur, thereby giving rise to a disadvantage in that good film forming cannot be made.

It is normal practice for the power supply apparatus, which applies DC voltage to the above-mentioned target, to be provided with an arc processing unit. As this kind of axe processing unit, mention may be made of one having: detecting means for detecting an output voltage or an output current from a DC power supply unit to the target; and those switching elements (arc switches) for cutting off the arc discharge which are disposed in parallel or in series between the positive and the negative outputs from the DC power supply unit to the target. Then, after having detected the occurrence of arc discharge by the amount of changes in the output voltage or output current, the above-mentioned switching elements are either short-circuited in case of parallel connection or are opened in case of series connection to thereby shut off the supply of arc energy to the plasma (load).

Further, in order to solve the above-mentioned disadvantage, there is also known a method in which the output impedance of the power supply apparatus is made to be of constant current. Ordinarily, there are many cases in which capacitors are disposed in parallel with each other in the output from the power supply apparatus to the target. The characteristics per unit time when the supply of the arc energy is shut off are shown to be of constant voltage. Then, when arc discharge occurs in the plasma, overcurrent rapidly occurs at a short period of time due to constant-voltage characteristics, resulting in an increase in the arc energy. However, by operating the above-mentioned switching elements at the time when the occurrence of the arc discharge is detected, the overcurrent can be prevented from increasing. But during the time interval of several μS in which the switching elements are actuated, this rapid increase in the current cannot be avoided.

Now, therefore, in order to prevent this rapid increase in the current, there is known in Patent Document 1 a method in which the output characteristics of the power supply apparatus are changed by switching the arc switches to constant current during the time required for the processing of suppressing the arc discharge (arc discharge suppression processing) so that the increase in the arc current can be prevented to the best extent possible during the time until the switching elements are actuated. In the method as described in Patent Document 1, however, there is a big problem in the characteristics after the arc processing has been finished. In other words, according to the method as described in Patent Document 1, when the output is brought back to normal after having finished the control of the switching elements thereby finishing the arc processing, there is a problem in that overvoltage occurs due to the inductance components of the plasma (load). This kind of problem, becomes remarkable when the area of the target, as a cathode, is large and the volume of the plasma becomes large (for example, when the external dimensions of a target become the order of several meters in a sputtering apparatus for manufacturing large-area flat panels, the transient inductance components will be more than several tens μH).

Then, due to a rapid increase in current from the output of the DC power supply apparatus which has been made to be constant current due to the inductance component, the voltage in the plasma will be more excessive than ordinary discharge voltage. For example, when the ordinary discharge voltage is −600 V, a voltage above −1000 V will be generated after having finished the arc processing by the switching elements in the arc processing circuit if the DC power supply apparatus is made to be of constant current. If this kind of overvoltage occurs, arc discharge comes to frequently occur.

PRIOR ART DOCUMENT

Patent Document 1: JP-A Hei10 (1998)-298754

SUMMARY

Problems To Be Solved By the Invention

In view of the above-mentioned points, this invention has a problem of providing a power supply apparatus which prevents the discharge voltage from getting excessive at the time of completion of the arc processing by effectively suppressing the increase in the current at the time of occurrence of the arc discharge that is directly connected to the generation of splashes and particles.

Means For Solving the Problems

In order to solve the above-mentioned problems, the power supply apparatus of this invention comprises: a DC power supply unit which applies a DC volte go to an electrode which comes into contact with a plasma; an arc processing unit which is capable of detecting arc discharge occurring in the electrode by positive and negative outputs from the DC power supply unit and which is also capable of arc discharge suppression processing; and an output characteristics switching circuit which, when occurrence of arc discharge is detected by, and arc discharge suppression processing is started by, the arc processing unit, switches the outputs to the electrode such that the outputs have constant-current characteristics and that the outputs to the electrode have constant-voltage characteristics by the time of completion of the arc discharge suppression processing.

According to this invention, by disposing the output characteristics switching circuit, in case arc discharge is generated for one cause or another, a rapid voltage drop occurs as a result of a rapid lowering in plasma impedance, with a consequent increase in the current. At this time, since the output from the DC power supply unit to the electrode has constant-current characteristics due to the arc processing unit, the rate of rise in current per unit time at the time of occurrence of arc discharge will be restricted. On the other hand, by switching to the constant-voltage characteristics just before, or at the same time as, the completion of the arc processing by the arc processing unit, the plasma voltage will be prevented from getting excessive as compared with the ordinary discharge voltage. As a result, the arc discharge can be prevented from occurring frequently.

According to this invention, preferably by employing the arrangement in which the output characteristics switching circuit comprises: an inductor which is disposed in at least one of the positive and the negative outputs; and a switching element which is connected in parallel with the inductor, the arrangement of switching from the constant-current characteristics to the constant-voltage characteristics can be easily materialized. In this case, the timing of switching the above-mentioned switching element may be appropriately set depending on the amount of duration of the arc discharge, i.e., depending on the time required for the residual energy of the arc discharge to become zero taking into account the power inputted into the target T, and the energy stored in the inductance components and capacitance components due to the wiring. In addition, at the time of micro-arc processing, the above-mentioned switching element is controlled to be switched off so that the rate of rise in the current at the time of occurrence of the arc discharge can be limited.

On the other hand, preferably, by employing an arrangement in which the output characteristics switching circuit comprises: an inductor which is disposed in at least one of the positive and the negative outputs; and a diode which is connected in parallel with the inductor and which short-circuits the inductor at the time of occurrence of an overvoltage, the diode becomes a switched-on state so that the inductor is short-circuited during the time of occurrence of the overvoltage. During that particular time, constant-voltage characteristics can be secured. According to this arrangement, since there is used no switching element that requires control over the switching, the circuit arrangement and its control can advantageously be simplified.

By the way in this invention, the electrode is, e.g., a target disposed in a processing chamber in which a sputtering method is performed.

EMBODIMENTS FOR CARRYING OUT THE INVENTION

With reference to the figures, a description will now be made of a power supply apparatus E, according to an embodiment of this invention, which is used for charging a target with a DC voltage.

Figure 1:
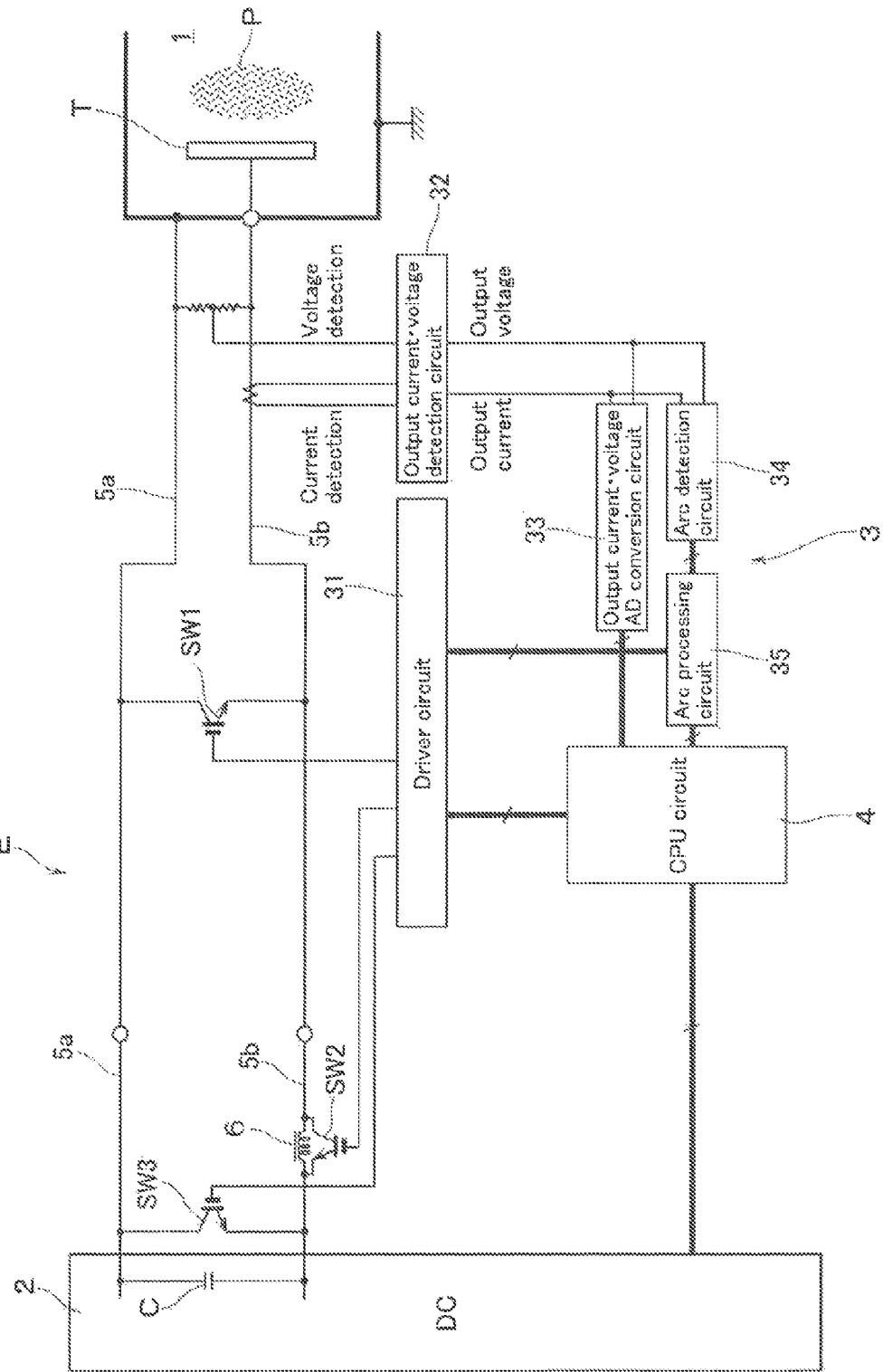
FIG. 1 is a block diagram schematically showing art arrangement of an embodiment of a power supply apparatus of this invention.

As shown in FIG. 1, the power supply apparatus E is disposed opposite to a substrate (not illustrated) which is disposed in a processing chamber 1, e.g., of a sputtering apparatus, and thus applies a negative DC voltage at a predetermined power to a target T which serves as an electrode that comes into contact with a plasma P. The power supply apparatus E has: a DC power supply unit 2 which enables to supply DC power; an arc processing unit 3; and a CPU circuit 4 which performs an overall control of the operation of the power supply apparatus. Although not particularly illustrated, the DC power supply unit 2 receives an input of commercial AC power (e.g., single phase AC 200 V, three-phase AC 200 V, etc.). This inputted AC power is rectified to convert it into DC power and is thereafter converted again into AC power by means of inverter-conversion. The output thereof is rectified to convert it once again into DC power so as to be outputted to the target T. An end portion of the positive output (cable) 5a from the DC power supply unit 2 is grounded (in this embodiment, is connected to a vacuum chamber which is grounded and defines the processing chamber 1). An end portion of the negative output (cable) 5b is connected to the target T. In FIG. 1 a reference numeral C in the DC power supply unit 2 denotes a capacitor.

The arc processing unit 3 is provided with a switching element (an arc switch) SW1 which is connected in parallel between both the positive and the negative outputs 5a, 5b. The switching element SW1 is constituted, e.g., by an IGBT (alternatively an FET or Tr may also be used). By means of a driver circuit 31 which is connected to the CPU circuit 4 in a manner to be capable of communication therewith, the switching ON or OFF of the switching element SW1 is controlled. Further, the arc processing unit 3 is provided with a detection circuit 32 which detects the output current and the output voltage. The output current and the output voltage detected by the detection circuit 32 are inputted into the CPU circuit 4 via an AD conversion circuit 33.

Further, the detection circuit 32 is connected to an arc detection circuit 34. When arc discharge occurs, the impedance of the plasma (load) P rapidly lowers, and a rapid voltage drop occurs, followed by current increase. The are detection circuit 34 thus detects the occurrence of arc discharge based on the amount of changes in the output current and/or the output voltage as detected by the detection circuit 32. The arc detection circuit 34 is connected to the are processing circuit 35 in a manner to be capable of communication therewith. The arc processing circuit 35 is connected to the CPU circuit 4 and the driver circuit 31 in a manner to be capable of communication therewith. When the occurrence of arc discharge is detected by the arc detection circuit 34, the fact of the detection is outputted to the arc processing circuit 35. The arc processing circuit 35 then controls the switching ON or OFF of the switching element SW1 via the driver circuit 31, thereby performing the arc suppression processing of the arc discharge.

Now, in the power supply apparatus E having the above-mentioned arrangement, when the output from the DC power supply unit 2 is of constant-voltage characteristics and the capacitive components become dominant over the inductance components, the impedance on the side of the plasma load becomes lower at the time of occurrence of arc discharge and, as a consequence, the output and the plasma P are coupled together so that the energy is rapidly discharged from the capacitance components to the output side. Therefore, within a time between the detection, by the arc detection circuit 34, of the occurrence of the arc discharge and shutoff of output to the target T by switching of the switching element SW1, there is a possibility that a large arc current flows.

In this embodiment an arrangement has been made that the negative output 5b is provided with an inductor 6 having a larger inductance value than the inductance component of the plasma P. In this case, when the rate of increase in the current at the time of micro-arc processing (to be described hereinafter) is limited to a value of 200% or less of the steady-state current value, more preferably is limited to a value of 150% or less, the rate of increase in the output current (Δi) at the time of occurrence of arc discharge can be calculated by the formula $$\Delta i = \Delta t \cdot V/L$$

where L is the inductance value of the inductor 6, V is the output voltage to the target T, and Δt is the time of current change. At this time, suppose that the output voltage to the target T is 500 V, the output current is 100 A, and the time of micro-arc processing (output shutoff) is 200 μS. Then, in order to make the current increase rate from the time of detection of overcurrent to the shutoff of the output to be 150%, Δi will be 50 A. In such a case, an inductor 6 having an inductance value of 2 mH may be connected to the negative output 5b. By the way, in this embodiment, the inductor 6 of a predetermined value is disposed in the negative output 5b, but the position of connecting the inductor 6 is not limited to the above example; one may be provided in the positive output 5a or in both the positive and the negative outputs 5a, 5b, respectively.

By the way, when the above-mentioned arrangement is employed, when the switching of the switching element SW1 is controlled to thereby return it to the ordinary output after having finished the arc processing by the arc processing unit 3, overvoltage may happen due to the inductance component of the plasma P. It is therefore necessary to prevent this overvoltage from occurring.

In this embodiment, an arrangement has been made such that another switching element SW2 is disposed in parallel with the inductor 6, and that the switching elements SW1, SW2 and the inductor 6 constitute the output characteristics switching circuit of this embodiment. The switching element SW2 may be constituted, e.g., by IGBT (FET or Tr may alternatively be used). Control of switching ON or OFF of the switching element SW2 can be made by the driver circuit 31. By the way in this embodiment, still another switching element SW3 is disposed in parallel between the positive and the negative outputs 5a, 5b from the DC power supply unit 2 to the target T. It is thus so arranged that, if judgment has been made that arc suppression processing cannot be performed by the micro-arc processing in the arc processing unit 3, output to the target T can instantly be shut off. In this case, the switching element SW3 can also be constituted, e.g., by IGBT (FET or Tr may also be used), and switching ON or OFF of the switching element SW3 can be controlled by the driver circuit 31.

Figure 2:
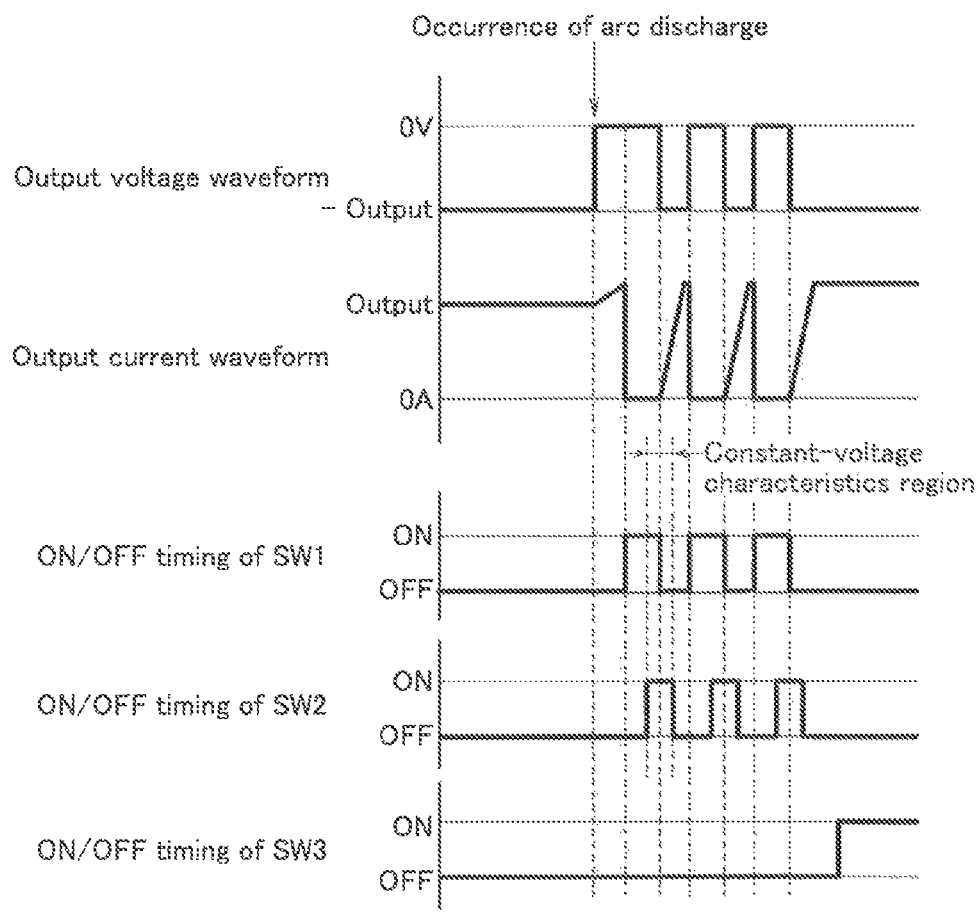
FIG. 2 is a diagram explaining the processing of arc suppression in arc discharge in the power supply apparatus of FIG. 1.

Next, with reference to FIGS. 2 and 3, a description will be made of the arc processing by the power supply apparatus E according to this embodiment. After having disposed the target T and the substrate inside the processing chamber 1, the processing chamber 1 is evacuated to a predetermined vacuum pressure. Then, a predetermined sputtering gas is introduced and the power supply apparatus E is operated to charge a predetermined negative electric potential to the target T. According to these operations, a plasma P atmosphere is formed inside the processing chamber 1, and by sputtering of the target T a thin film is formed on the surface of the substrate.

Then, should arc discharge occur for one reason or another during sputtering, since the impedance of the plasma P will rapidly lower, a rapid voltage drop occurs and, accompanied thereby, the current will increase. At this time if the output current and the output voltage that have been detected by the detection circuit 32 of the arc processing unit 3 change beyond a predetermined range, the occurrence of arc discharge will be detected by the arc detection circuit 34. For example, a change in the output current beyond a predetermined range is recognized as a pre-stage phenomenon of arc discharge (micro-arc), and the arc suppression processing is performed.

Figure 3:
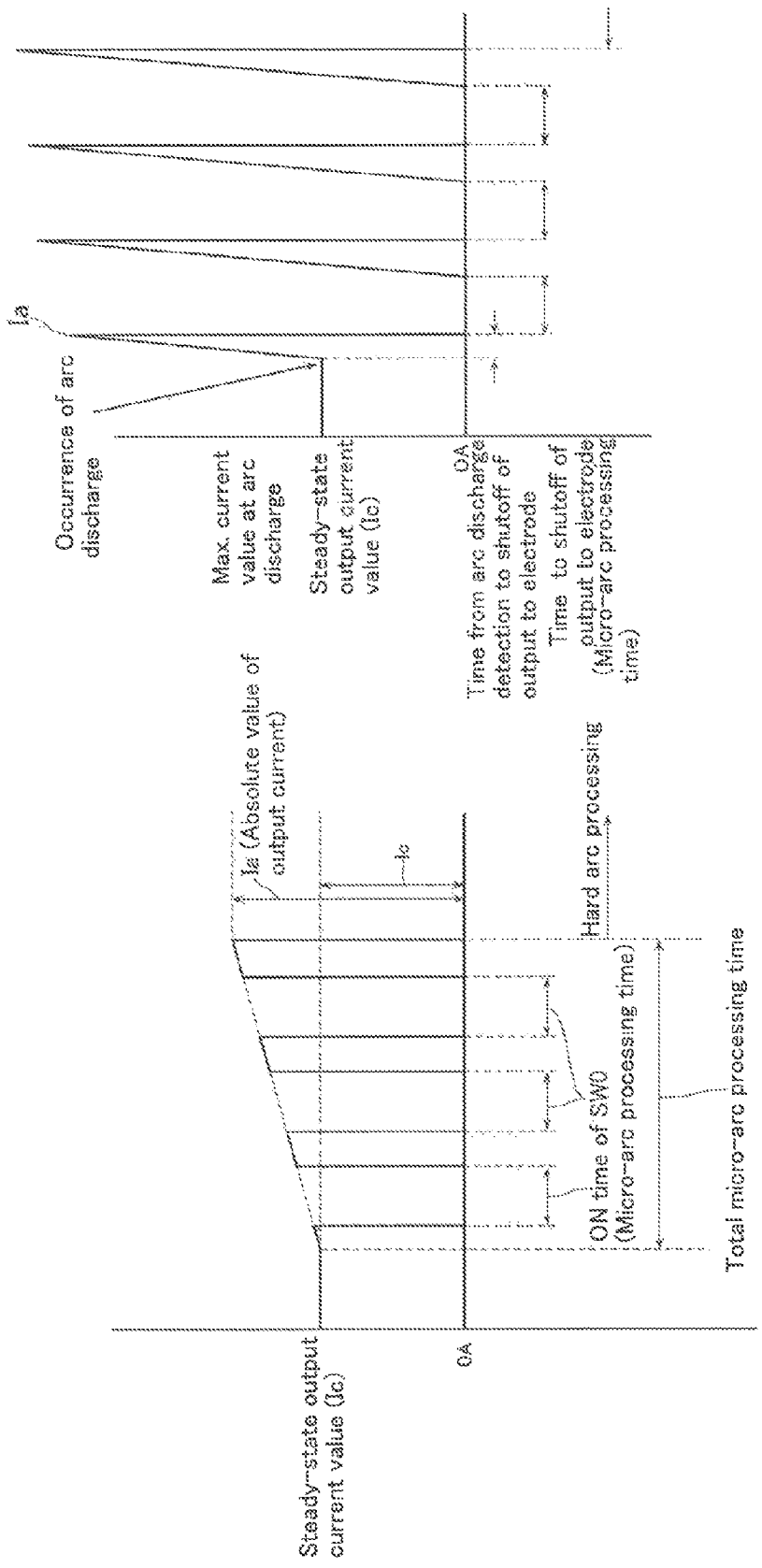
FIG. 3 is a diagram, explaining the processing of arc discharge.

If a description is made with reference to FIG. 3, when the output current Ia detected by the detection circuit 32 has exceeded a steady-state output current value Ic, this fact is recognized by the arc processing circuit 35 as a pre-stage phenomenon of the occurrence of the arc discharge. The switching element SW1 which is for output short-circuiting is short-circuited (switched ON) by the driver circuit 31 for output oscillation via the CPU circuit 4 and the arc processing circuit 35. At this time, since the inductor 6 is disposed in the negative output 5b, the output from the DC power supply unit 2 will be of constant-current characteristics, whereby the rate of rise in current per unit time at the time of occurrence of arc discharge can be limited.

Then, when the short-circuiting of the switching element SW1 is released (OFF) after the lapse of a predetermined period of time (several μS through several mS), output to the target T will be resumed. At this time, either just before or at the same time as the releasing (OFF) of the switching element SW1, the other switching element SW2 for short-circuiting the inductor 6 will be short-circuited (ON) (see FIG. 2). By the way the ON time of the SW1 will be appropriately set (for a time about 10 μS) depending on the time of duration of the arc discharge, i.e., the time required for the residual energy of the arc discharge to become zero, while taking into consideration the power charged to the target T, and the energy stored in the inductance component and the capacitance component due to the wiring. In this manner, by switching ON the switching element SW2, the inductor 6 is short-circuited for a predetermined period of time (several μS) and, in this state, the output from the DC power supply unit 2 to the target T will be of constant-voltage characteristics. As a result, a rapid increase in current from the output of the DC power supply unit 2 can be prevented, and the voltage of plasma P can be prevented from becoming more excessive than the ordinary discharge voltage. And after the releasing of the short-circuiting of the switching element SW1, the other switching element SW2 for short-circuiting the inductor 6 will be switched to release (OFF) the short-circuiting of the inductor 6 after the lapse of time of several μS or more. In case the next arc discharge occurs after the short-circuiting of the switching element SW1 has been released, there will be an overcurrent if the inductor 6 remains to be short-circuited. Therefore, it becomes necessary to set the timing of switching the other switching element SW2 in order to be able to effectively cause to function the inductor 6 when the next arc discharge occurs. Then, a judgment is made by the arc detection circuit 34 as to whether the output current Ia has exceeded the steady-state output current value Ic or not. If the output current Ia still remains to exceed the steady-state output current value Ic, the switching element SW1 is short-circuited again by the driver circuit 31. After the lapse of a predetermined period of time, the processing of recovering the output is performed in the same manner as noted above.

If the output current Ia remains to be in a state of exceeding the steady-state output current value Ic or if the output current Ia exceeds a predetermined value that has been set in advance even after these series of micro-arc processing are repeated in a plurality of times, a judgment is made that there will occur an arc discharge that will induce the occurrence of splashes or particles. The switching element SW3 will thus be switched ON by the control, from the CPU circuit 4, and the output from the DC power supply unit 2 will be stopped (hard-arc processing). Even during this processing, by maintaining the arc current value below 200% of the steady-state current value, the arc energy to be released can be made smaller and the occurrence of the splashes and the particles can effectively be restricted.

As described hereinabove, according to the power supply apparatus E of this embodiment, since the output characteristics switching circuits 6, SW2 are disposed, in case the arc discharge occurs for one reason or another, the rate of increase in current per unit time at the time of occurrence of the arc discharge can be limited because the output from the DC power supply unit 2 to the target T is of constant-current characteristics. On the other hand, since the constant-voltage characteristics are attained just before or at the same time as finishing the arc processing by the arc processing unit 3, the voltage of the plasma P can be prevented from getting more excessive than the ordinary discharge voltage and, as a consequence, the arc discharge can be prevented from occurring frequently.

Figure 4:
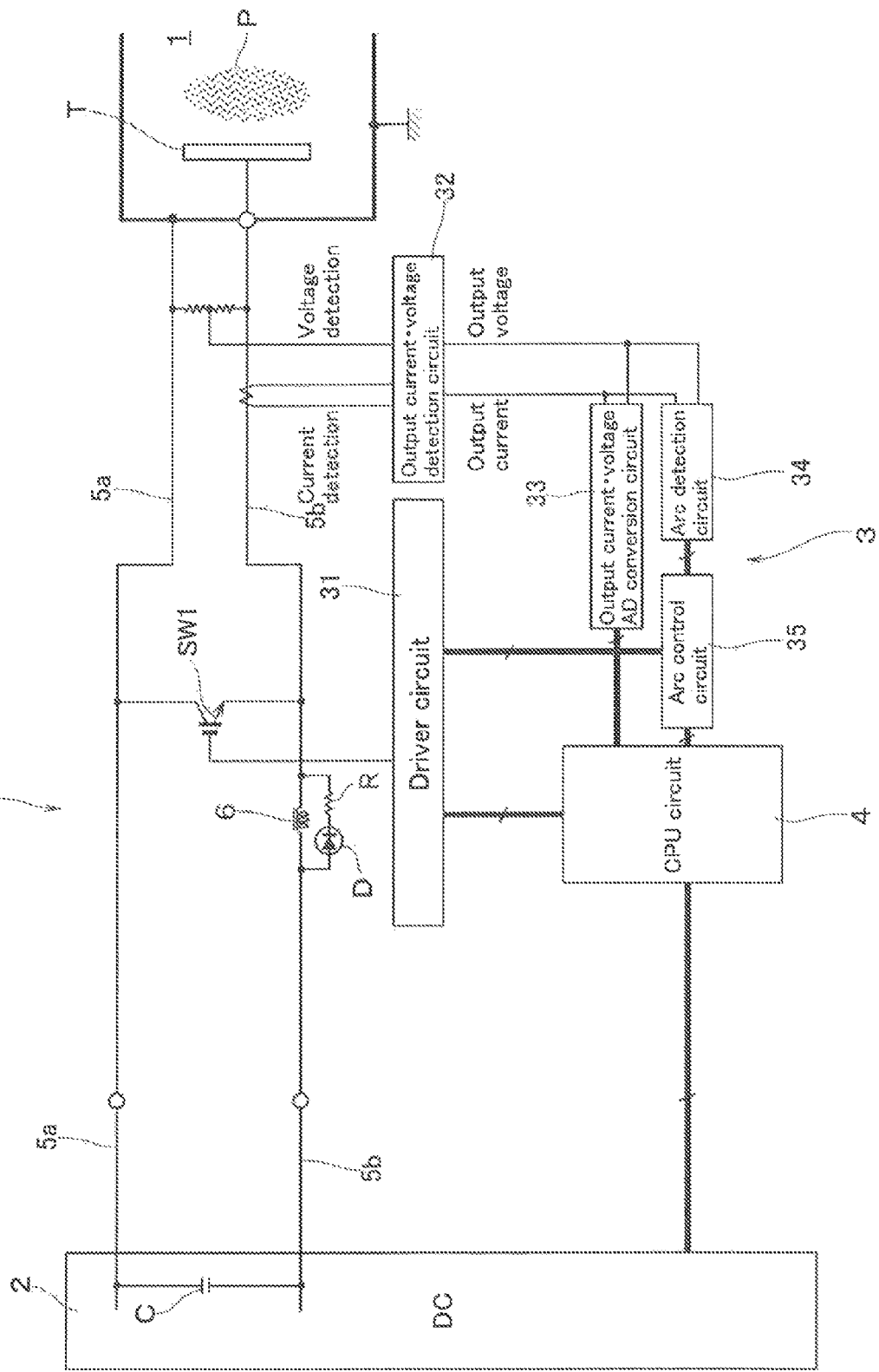
FIG. 4 is a block diagram, schematically showing an arrangement of a power supply apparatus according to another embodiment.

A description has so far been made of the power supply apparatus E according to an embodiment of this invention, but this invention is not to be limited to the above. In the above-mentioned embodiment a description has been made of an example in which IGBT, FET, and Tr are used as the switching elements SW1 through SW3, but this invention is not limited thereto. Further, a description has been made of an example in which the output characteristics switching circuit is constituted by the inductor 6 and the switching element SW2. However, as shown in FIG. 4, there may be employed an arrangement including an inductor 6 which is disposed in at least one of the positive and the negative outputs 5a, 5b, and a diode D and a resistor R which are connected in parallel with the inductor 6 and which are arranged in series with each other so as to short-circuit the inductor 6 at the time of occurrence of an overvoltage. According to this arrangement, while the overvoltage has occurred, the diode D becomes a switched-on state to thereby short-circuit the inductor 6. During that period of time, the constant-voltage characteristics can thus be secured. According to this arrangement, since there is used no switching element whose switching must be controlled, the circuit arrangement and its control can be simplified. As the resistor R, there may be used one within the range of several Ω through 10Ω.

In addition, according to the above-mentioned embodiment, a description has been made of an example in which the switching element SW1 as an arc switch is connected in parallel between the positive and the negative outputs 5a, 5b. This invention is, however, not limited to the above, but may be applied to one in which the switching element SW1 is connected in series. By the way, in case the switching element SW1 is connected in parallel with the positive and the negative outputs 5a, 5b, the DC power supply unit 2 is in a state in which the load is short-circuited while the arc suppression processing is being performed. Therefore, without any particular processing, overvoltage will not occur. On the other hand, in case the switching element SW1 is connected in series, the DC power supply unit 2 will be that the load is released. In case of constant power control, since the voltage will rise, there will be the necessity to stop the output on the part of the DC power supply unit.

Figure 5:
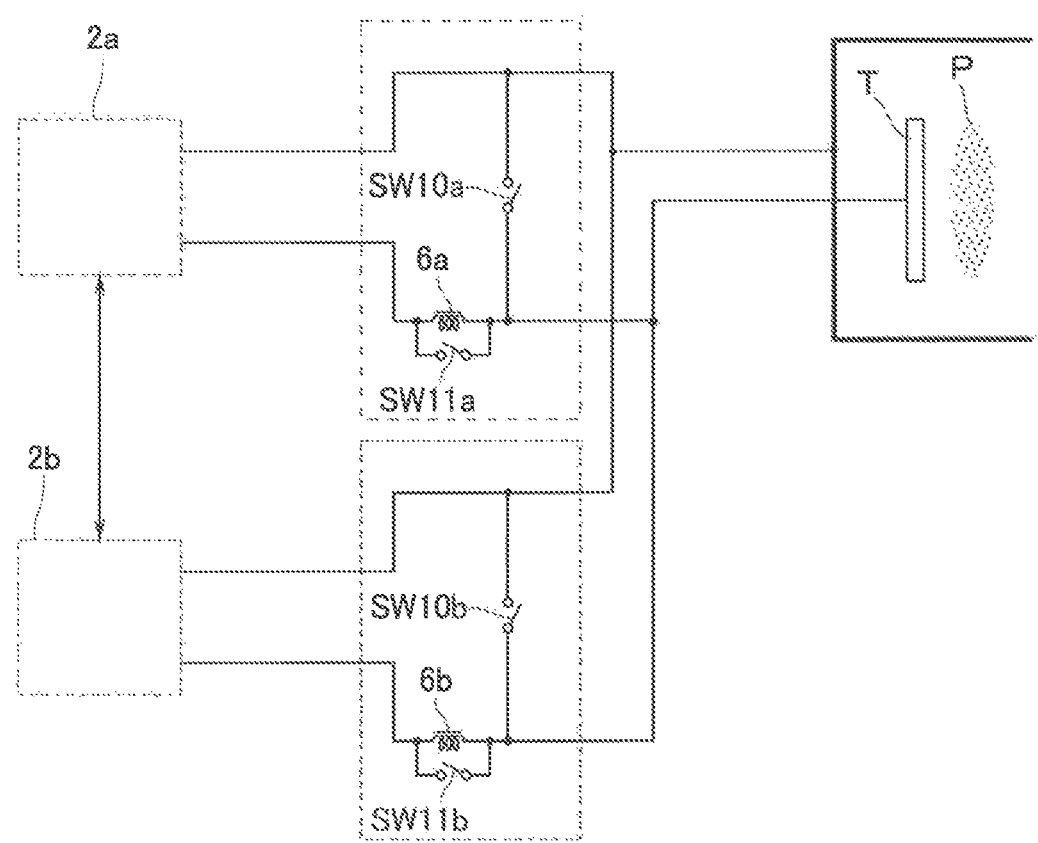
FIG. 5 is a diagram explaining an example of outputting to a target by using a plurality of power supply apparatuses according to this invention.

Further, in the above-mentioned embodiment, a description has been made of an example in which power is supplied to a single target T by means of a single power supply apparatus E. This invention is, however, applicable also to the case in which larger power supply is outputted by a plurality of power supply apparatuses to a single target T as shown in FIG. 5. In this kind of case, for every one of the DC power supply units 2a, 2a, inductors 6a, 6b as the output switching circuit, switching elements 10a, 10b as the arc switches, and the switching elements SW11a, SW11b for short-circuiting the inductors 6a, 6b may be disposed.

DESCRIPTION OF REFERENCE NUMERALS

E power supply apparatus
1 processing chamber
2 DC power supply unit
3 arc processing unit
5a, 5b outputs
6 inductor
SW1 through SW3 switching elements
D diode
T target (electrode)

What is claimed is:
1. A power supply apparatus comprising:
 a DC power supply unit which applies a DC voltage to an electrode which comes into contact with a plasma;
 an arc processing unit which is capable of detecting arc discharge occurring in the electrode by positive and negative outputs from the DC power supply unit and which is also capable of arc discharge suppression processing; and
 an output characteristics switching circuit which, when occurrence of arc discharge is detected by, and arc discharge suppression processing is started by, the arc processing unit, switches the outputs to the electrode such that the outputs have constant-current characteristics and that the outputs to the electrode have constant-voltage characteristics at the DC voltage after the constant-current characteristics.

2. The power supply apparatus according to claim 1, wherein the output characteristics switching circuit comprises:
 an inductor which is disposed in series between the electrode and at least one of the positive and the negative outputs; and
 a switching element which is connected in parallel with the inductor.

3. The power supply apparatus according to claim 1, wherein the output characteristics switching circuit comprises:

an inductor which is disposed in series between the electrode and at least one of the positive and the negative outputs; and a diode which is connected in parallel with the inductor and which short-circuits the inductor at the time of occurrence of an overvoltage.

4. The power supply apparatus according to claim 1, wherein the electrode is a target which is disposed in a processing chamber in which a sputtering method is performed.

5. The power supply apparatus according to claim 2, wherein the electrode is a target which is disposed in a processing chamber in which a sputtering method is performed.

6. The power supply apparatus according to claim 3, wherein the electrode is a target which is disposed in a processing chamber in which a sputtering method is performed.

7. The power supply apparatus according to claim 2, wherein the switching element is turned on before the outputs to the electrode is switched to have constant-voltage characteristics substantially at the DC voltage.

* * * * *